(12) United States Patent
Floman et al.

(10) Patent No.: US 7,036,054 B2
(45) Date of Patent: Apr. 25, 2006

(54) MEMORY BUS CHECKING PROCEDURE (75) Inventors: Matti Floman, Kangasala (FI); Jani Klint, Tampere (FI)

(73) Assignee: Nokia Corporation, Espoo (FI)

( * ) Notice: Subject to any disclaimer, the term of this patent is extended or adjusted under 35 U.S.C. 154(b) by 29 days.

(21) Appl. No.: 10/614,341

(22) Filed: Jul. 2, 2003

(65) Prior Publication Data

US 2005/0005209 A1  Jan. 6, 2005

(51) Int. Cl.
*G01R 31/28* (2006.01)
(52) U.S. Cl. ..................................... 714/712
(58) Field of Classification Search ............... 710/104; 714/712, 715, 819–823, 748, 746, 750; 709/237; 455/67.11, 67.13, 67.14, 226.1
See application file for complete search history.

(56) References Cited

U.S. PATENT DOCUMENTS 6,473,871 B1 * 10/2002 Coyle et al. .............. 714/715

FOREIGN PATENT DOCUMENTS

WO    WO 02/15020    * 2/2002

* cited by examiner

*Primary Examiner*—Albert Decady
*Assistant Examiner*—John J. Tabone, Jr.
(74) *Attorney, Agent, or Firm*—Ware, Fressola, Van Der, Sluys & Adolphson LLP (57) ABSTRACT

A method for checking usable width of a data bus linking a host device and a memory card. Preferably, at the boot up process the host device sends a test bit pattern to the memory card through the data bus. The test bit pattern can be (1010 . . . ) or (0101 . . . ). Upon receiving the test bit pattern, the memory card sends a response bit pattern to the host device through the same data bus. The response bit pattern is complement to the test bit pattern so as to allow the host device to compare the response bit pattern with the test bit pattern, and determines the usable width of the data bus based on the comparison result.

28 Claims, 4 Drawing Sheets

MEMORY BUS CHECKING PROCEDURE

FIELD OF THE INVENTION

The present invention relates generally to an electronic memory card and its use in a host device and, more particularly, to a method of checking the electrical functionality of a data bus linking such memory card and host device.

BACKGROUND OF THE INVENTION

Memory cards are known in the art. For example, a flash-based card is a small, encapsulated card containing a large amount of non-volatile memory, which can be removably inserted into a portable electronic device. Such memory cards are commonly used in personal computers, notebook computers, personal digital assistants, mobile phones, and cameras where a data storage device can be removed and replaced by another. In particular, a MultiMediaCard is small in size but currently can store up to 128 MB of data. A MultiMediaCard package has a seven pad serial interface and is easily integrated into various host devices. A host device generally provides only one slot for insertion of one MultiMediaCard. That is because only one card/host can talk at a time. The host has a data processor such as an ASIC (Application Specific Integrated Circuit) or a chip set operatively connected to the card slot. As disclosed in Cedar et al. (WO 02/15020), as part of a system initialization routine, a unique address is assigned to each memory card inserted. A unique card identification (CID) number is stored in a register of each card during manufacturing. In order for the host processor to initially be able to address each card and, in turn, to assign such addresses, the host commands all cards to simultaneously transmit their CIDs. Thereafter, a unique, small address is assigned to each of the cards inserted.

There are two main ways to affect data rate between memory and main processor. One is bus frequency and the other is bus width. The data rate can also be affected by different clocking methods such as single edge and dual edge data clocking using upward/downward going edges. With today's known technology, the bus width is obtained by checking a value from the internal register located in the memory card.

It is advantageous and desirable to eliminate the internal register in the memory card and the register checking procedure for determining the width of the memory bus.

SUMMARY OF THE INVENTION

The present invention uses a memory bus checking procedure to determine the width of the memory bus. Preferably, at the boot up process, the host device sends a test bit pattern to the memory card inserted in the device slot, and compares the test bit pattern to the response bit pattern provided by the memory card. Advantageously, the response bit pattern is complement to the test bit pattern. With this simple procedure, it is possible to determine the usable data bus width. The usable data bus width may be different from the maximum bus width of the host device or the bus width of the memory card. It is possible that the maximum bus width of the host device is wider, narrower than or equal to the bus width of the memory card.

If desirable, a second cycle of the bus checking procedure is carried out to ensure that the bits are not stuck to '0' or '1'. Advantageously, the test bit pattern for the second cycle is complement to that of the first bit pattern. With such handshake procedures, the electrical functionality of the data bus can be verified. Moreover, it is possible to have host devices of various data bus widths mixed with memory cards of various data bus widths. With the present invention, it is no longer necessary to check the bus width value from the internal register situated in the memory card.

According to the first aspect of the present invention, there is provided a method for checking electronic functionality of a data bus between a first electronic module and a second electronic module operatively connected to the first electronic module. The method comprises:

conveying to the second electronic module a first bit pattern through the data bus;

generating a second bit pattern in the second electronic module, based on the received first bit pattern; and conveying the second bit pattern to the first electronic module through the data bus.

The method further comprises comparing the received second bit pattern to the first bit pattern for determining the usable data bus width.

The second bit pattern has a predetermined relationship to the received first bit pattern in the second electronic module.

Preferably, each bit in the first bit pattern and the second bit pattern has a value of either '0' or '1', and second bit pattern is complement to the received first pattern such that a bit in the second bit pattern has a value different from the value of the corresponding bit in the received first bit pattern.

If the received second bit pattern has only a section in which the pattern is complement to the corresponding part of the first bit pattern, then the comparing step determines the usable width of the data bus based on the section.

It is also possible to carry out the method steps in a second cycle, wherein the bit pattern conveyed to the second electronic module in the second cycle is complement to the first bit pattern in the first cycle, and the response bit pattern conveyed back to the first electronic module in the second cycle also has a predetermined relationship with the bit pattern received by the second electronic module in the second cycle.

The second electronic module can be a memory card.

According to the second aspect of the present invention, there is provided a software program for use in a first electronic module for checking electronic functionality of a data bus between the first electronic module and a second electronic module. The program comprises:

a first code for comparing a first bit pattern provided to the second electronic module through the data bus to a second bit pattern received from the second electronic module in response to the first bit pattern as received in the second electronic module, the second bit pattern having a predetermined relationship to the received first bit pattern; and a second code, based on the predetermined relationship, for determining a usable bus width of the data bus for conveying data between the first electronic module and the second electronic module.

The program further comprises a third code for generating the first bit pattern.

Advantageously, the first code also compares a third bit pattern provided to the second electronic module through the data bus to a fourth bit pattern received from the second electronic module in response to the third bit pattern as received in the second electronic module, and wherein the third bit pattern is complementary to the first bit pattern, and the fourth bit pattern having the predetermined relationship to the received third bit pattern, so as to allow the second code to determine the usable bus width of the data bus.

According to the third aspect of the present invention, there is provided a memory unit for use in an electronic device, the electronic device having a host electronic module for processing data and a data bus for operatively connecting the host module to the memory unit. The memory unit comprises:

means for receiving a first bit pattern from the host module through the data bus; and means, responsive to the received first bit pattern, for providing a second bit pattern on the data bus, wherein the second bit pattern has a predetermined relationship with the received first bit pattern so as to allow the host module to determine a usable bus width of the data bus based on the second bit pattern as received in the host module.

According to the fourth aspect of the present invention, there is provided an electronic device having means to receive a memory unit. The electronic device comprises:

a data processing unit;

a data bus linking the data processing unit to the memory unit; and a program for checking electronic functionality of the data bus, the program comprising:

a first code for providing a first bit pattern to the memory unit through the data bus;

a second code for comparing the first bit pattern with a second bit pattern received from the memory unit, the second bit pattern provided in response to the first bit pattern the second bit pattern having a predetermined relationship to the first bit pattern as received in the memory unit, and a third code for determining a usable width of the data bus based on the received second bit pattern.

The memory unit comprises:

means for receiving the first bit pattern from the host module through the data bus; and means, responsive to the received first bit pattern, for providing the second bit pattern on the data bus.

The electronic device comprises a mobile phone.

The present invention will become apparent upon reading the description taken in conjunction with FIGS. 1 to 6.

BEST MODE FOR CARRYING OUT THE INVENTION

Figure 1:
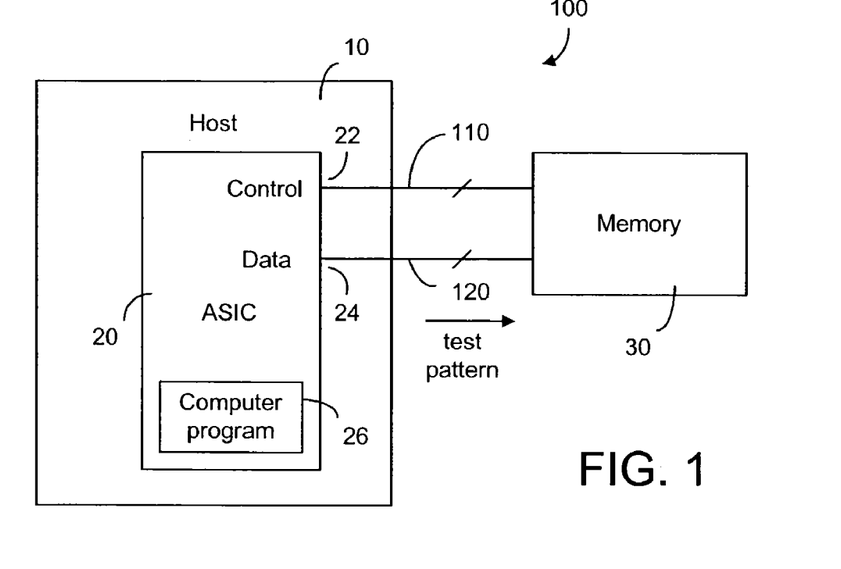
FIG. 1 is a block diagram illustrating an electronic device having a host module connected to a memory card, wherein the host module is sending a test bit pattern to the memory card.
Figure 2:
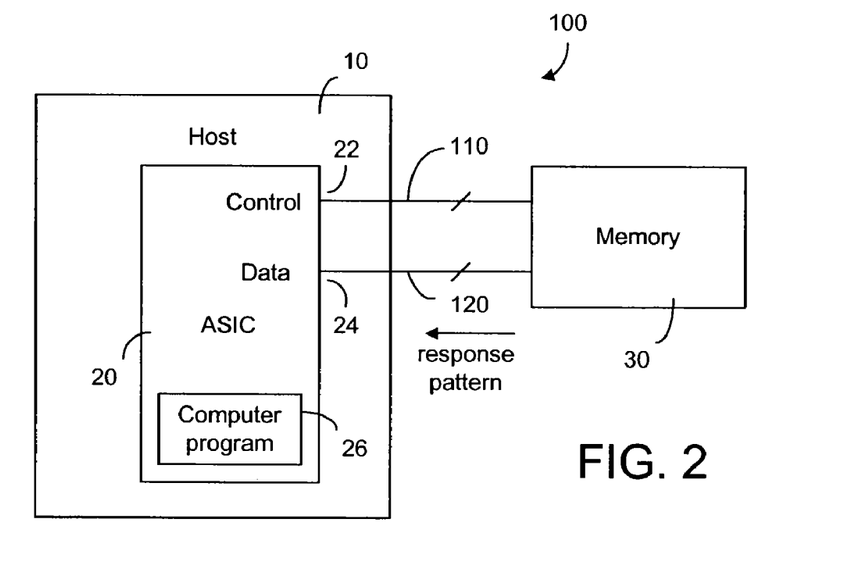
FIG. 2 is a block diagram illustrating the same electronic device wherein the memory card is sending a response bit pattern to the host module.

FIGS. 1 and 2 depict an electronic device 100 having a host module 10 that has one or more sockets to allow one or more memory cards to be inserted in the module. The memory cards are represented by a memory unit 30. The host module 10 further comprises a processor or ASIC (Application Specific Integrated Circuit) 20 having a control port 22 and a data port 24, each has a bus (110, 120) line linking the memory unit 30. According to the present invention, the width of the data bus 120 is obtained during the boot up procedures of the memory unit 30.

The memory bus checking method, according to an embodiment of the present invention, comprises two steps. In the first step, as shown in FIG. 1, the host module 10 sends a test bit pattern to the memory unit 30. Preferably, the test bit pattern has a form of alternate 0 and 1 such as (01010101 . . . ) and (10101010 . . . ). The pattern length, or the number of bits in the bit pattern, is the same as the maximum data bus width of the host module 10. With the alternate 0 and 1 bit pattern, the neighboring pins will have opposite values.

Upon receiving the test bit pattern, the memory unit 30 sends a response bit pattern back to the host module 10, as shown in FIG. 2. Preferably, each of the bits in the response pattern is complement to the corresponding bit in the test pattern. For example, if the test pattern is (01010101 . . . ), then the response pattern is (10101010 . . . ). When the host module 10 receives the response pattern from the memory unit 30, it compares the response pattern to the test pattern. If the response pattern is an exact mirror image of the test pattern, then the width of the data bus is the maximum data bus width of the host module 10 assuming all the "bits" on the data bus function properly. A bit functions properly if it is not stuck to '1' or '0'. However, if the memory unit 30 can only receive fewer bits than the number of bits in the test pattern, the response pattern received by the host module 10 will not be exactly a mirror image of the test pattern. In that case, the memory unit 30 sets its external data bus width according to the number of valid bits that it receives.

There are at least two ways to set up the bus width for the memory:

The first one is that the memory unit 30 sets its bus width according to the valid bits that it receives. As the memory unit 30 can receive fewer bits than the number of bits in the test pattern, it provides a response pattern based on the received bit pattern.

The second one is that the host module determines the card bus width and then communicates the bus width to the memory unit with an additional command cycle. In this case, the memory unit can receive the same number of bits as that in the test pattern, or it can receive more bits than the number of bits in the test pattern as described below:

When the memory unit 30 can receive more bits than the number of bits in the test pattern, the response pattern received by the host module 10 will be the mirror image of the test pattern, assuming all the bits function properly. In that case, the host module 10 sets the bus width according to the number of the test pattern.

When the memory unit 30 can receive the same number of bits as that in the test pattern but one or more of the bits are defective, the response pattern as received by the host module 10 may not be exactly a mirror image of the test pattern. Thus, if the host module 10 determines, through the comparison process, that it receives fewer valid data bits than what it sends, then the number of received bits defines the used data bus width during the memory access. Otherwise, the used data bus width is the same as the maximum data bus width of the host module 10.

For example, the host module 10 has an 8-bit data bus and it sends out a test bit pattern of(10101010) to the memory unit 30. If the response pattern received by the host module 10 is (01011111), it is possible that the MultiMediaCard has an 8-pin data bus but the last four bits are stuck to "1". But it is also possible that the MultiMediaCard has a 4-bit data bus if the bus width is $2^n$ (1, 2, 4 or 8 . . . ). In this case, it can safely assume that the number of valid bits for memory access is 4. Nevertheless, it is useful to execute a second test cycle such that the host module 10 sends out a different test bit pattern of (01010101) to make sure that the response pattern is (10101111). In general, if the data bus is not necessarily 2's involution, the second cycle is needed in order to determine whether the card has a 3 or 5 bit data bus when the response pattern in response to the test pattern (10101010) is (01011111).

Likewise, when the host module 10 has a 4-bit data bus but the width of the card's data bus is greater than 4, it is necessary to send out the second cycle test pattern in order to determine whether the card has a 3-bit or 4-bit data bus.

In any case, it is preferred that the test bit pattern of the second cycle is complement to that of the first cycle, and the response bit pattern is complement to the corresponding test bit pattern. The test procedure for the above examples is summarized in TABLE I and TABLE II.

The test bit pattern can be generated by a software program 26 operatively connected to the ASIC 20. The software program 26 may include a computer code for carrying out the bit pattern comparison in order to determine the width of the data bus. However, the test pattern and the comparison algorithm can be part of the ASIC functions.

The present invention provides an efficient way to check the electrical functionality of a data bus, including the situation where certain bits on the bus are stuck to "0" or "1". The width of the data bus can be determined by the host module 10 without accessing the internal register in the memory unit 30. Because the used data bus width is determined through handshake procedures as described above, it is possible to have various host unit data bus widths mixed with various card memory bus widths.

Figure 3:
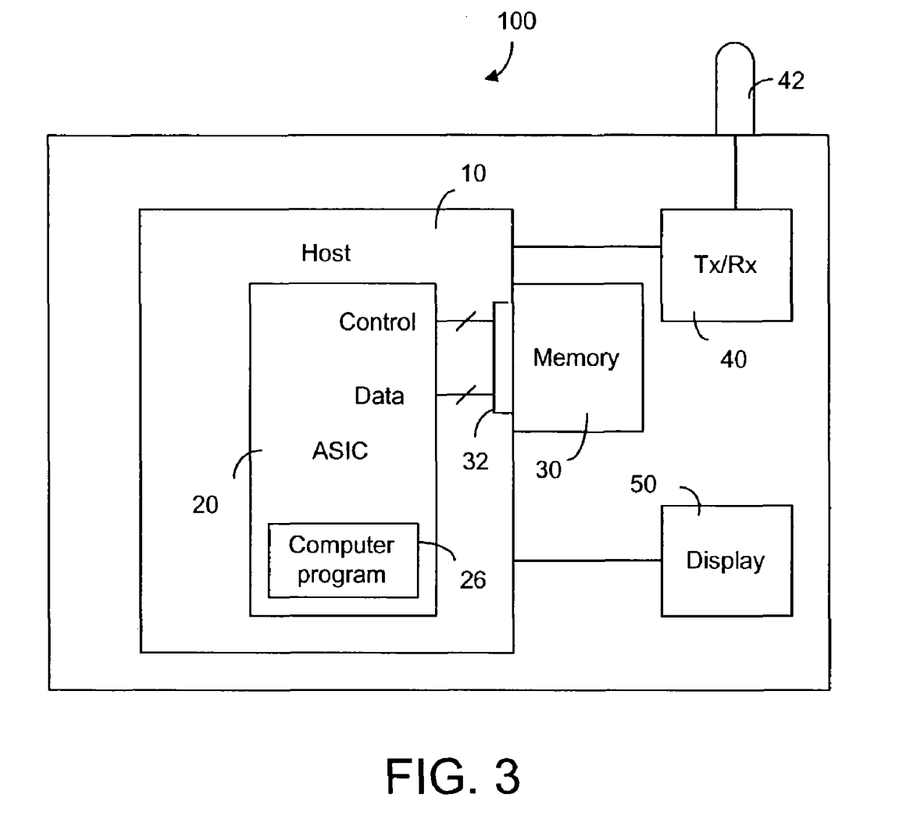
FIG. 3 is a schematic representation illustrating a mobile phone capable of checking the data bus, according to the present invention.

The electronic device 100 can be a mobile phone, an imaging device, a personal computer, a notebook computer, a personal digital assistant device (PDA), a music storage and playing device such as an MP3 player, a multimedia streaming device and the like. FIG. 3 is a schematic representation illustrating a mobile phone, which has a socket 32 to receive a memory unit 30, a transceiver 40 operatively connected to the host electronic module 10 and an antenna 42 for data communication, and a display 50 to display text and images. The memory unit 30 can be removed from the socket 32 and replaced with another memory unit.

Figure 4:
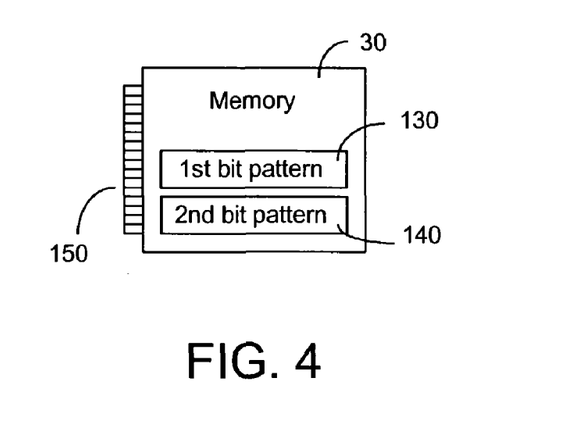
FIG. 4 is a schematic representation illustrating a memory unit having means for generating a response bit pattern in response to a test bit pattern.

FIG. 4 is a schematic representation of a memory unit 30, which is programmed to generate a response bit pattern 140 in response to a test bit pattern 130. The response bit pattern has a predetermined relationship to the test bit pattern. As shown in FIG. 4, the memory unit 30 has pins 150 for inserting into the socket 32 (FIG. 3) of the host module 10. The pins 150 include pins to be connected to the control bus 110 and pins to be connected to the data bus 120.

In general, it is preferable to conduct a two-cycle test procedure as part of the boot up process in order to determine the width of the data bus to be used in conveying data between a host module and an inserted MultiMediaCard in an electronic device. It is, however, possible to determine the bus width with one test cycle. If the data bus is operated in a pull-up implementation (i.e., the bits are normally high), it is preferred that the test bit pattern starts with (1010 . . . ). If the data bus is operated in a pull-down implementation (i.e., the bits are normally low), it is preferred that the test bit pattern starts with (0101 . . . ). As such, the second cycle may not be necessary. But if the data bus is operated in a high-z (non-pull) implementation, two cycles with complementary bit patterns are preferred.

TABLE I

| | 8-pin host and 4-pin card | | | |
|---|---|---|---|---|
| Host | | MMC Bus | Card | |
| Output | Input | default | Input | Output |
| Cycle I | | | | |
| 1 | 0 | 1 | 1 | 0 |
| 0 | 1 | 1 | 0 | 1 |
| 1 | 0 | 1 | 1 | 0 |
| 0 | 1 | 1 | 0 | 1 |
| 1 | 1 | 1 NC | | |
| 0 | 1 | 1 NC | | |
| 1 | 1 | 1 NC | | |
| 0 | 1 | 1 NC | | |
| Cycle II | | | | |
| 0 | 1 | 1 | 0 | 1 |
| 1 | 0 | 1 | 1 | 0 |
| 0 | 1 | 1 | 0 | 1 |
| 1 | 0 | 1 | 1 | 0 |
| 0 | 1 | 1 NC | | |
| 1 | 1 | 1 NC | | |
| 0 | 1 | 1 NC | | |
| 1 | 1 | 1 NC | | |

Note 1:
In the first cycle, the last four bits do not change state -> stuck to one (number of pins unknown) or 4 bit bus. In this case by using assumption that data bus is 2's multiple bus could be defined to be 4. If non-even data bus widths are allowed then second cycle is needed.

Note 2:
None of the last 4 bits are changing status so bus width is 4 since last four are not working.

TABLE II

| 4-pin host and 8-pin card | | | | |
|---|---|---|---|---|
| Host | | MMC Bus | Card | |
| Output | Input | default | Input | Output |
| 1 | 0 | 1 | 1 | 0 |
| 0 | 1 | 1 | 0 | 1 |
| 1 | 0 | 1 | 1 | 0 |
| 0 | 1 | 1 | 0 | 1 |
| NC | | NA | 1 | 0 |
| NC | | NA | 1 | 0 |
| NC | | NA | 1 | 0 |
| NC | | NA | 1 | 0 |

Note:
In this case by using assumption that data bus is 2's multiple bus could be defined to be 4. If non-even data bus widths are allowed then second cycle is needed to define if data bus width is 3.

Figure 5:
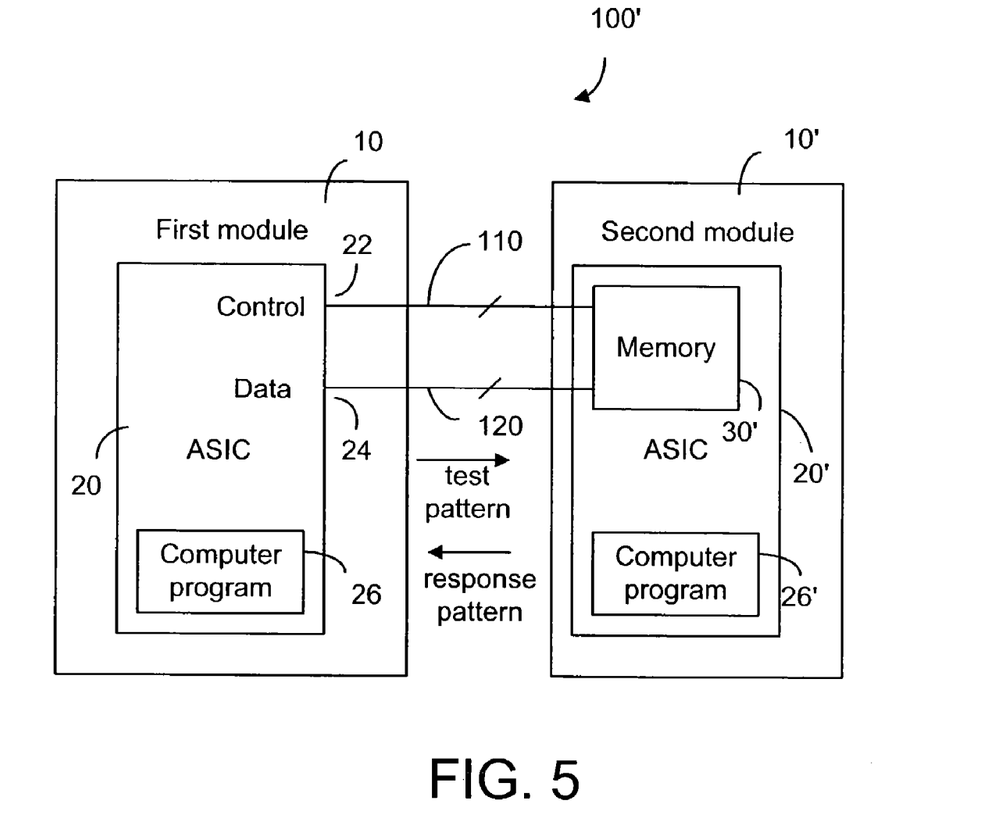
FIG. 5 is a block diagram illustrating patterns being exchanged between a first electronic module and a second module for determining the usable data bus width therebetween.

The present invention has been disclosed in regard to the data bus linking a host electronic module and a memory card. However, the same checking procedure can also be used to determine the usable width of a data bus linking a first electronic module to a second electronic module, as shown in FIG. 5. As shown in FIG. 5, the first electronic module 10 is the host module that sends the test bit pattern to and receives the response bit pattern from the second electronic module 10'. In particular, the control bus 110 and the data bus 120 are connected to a memory unit 30' in the second electronic module 10'.

Figure 6:
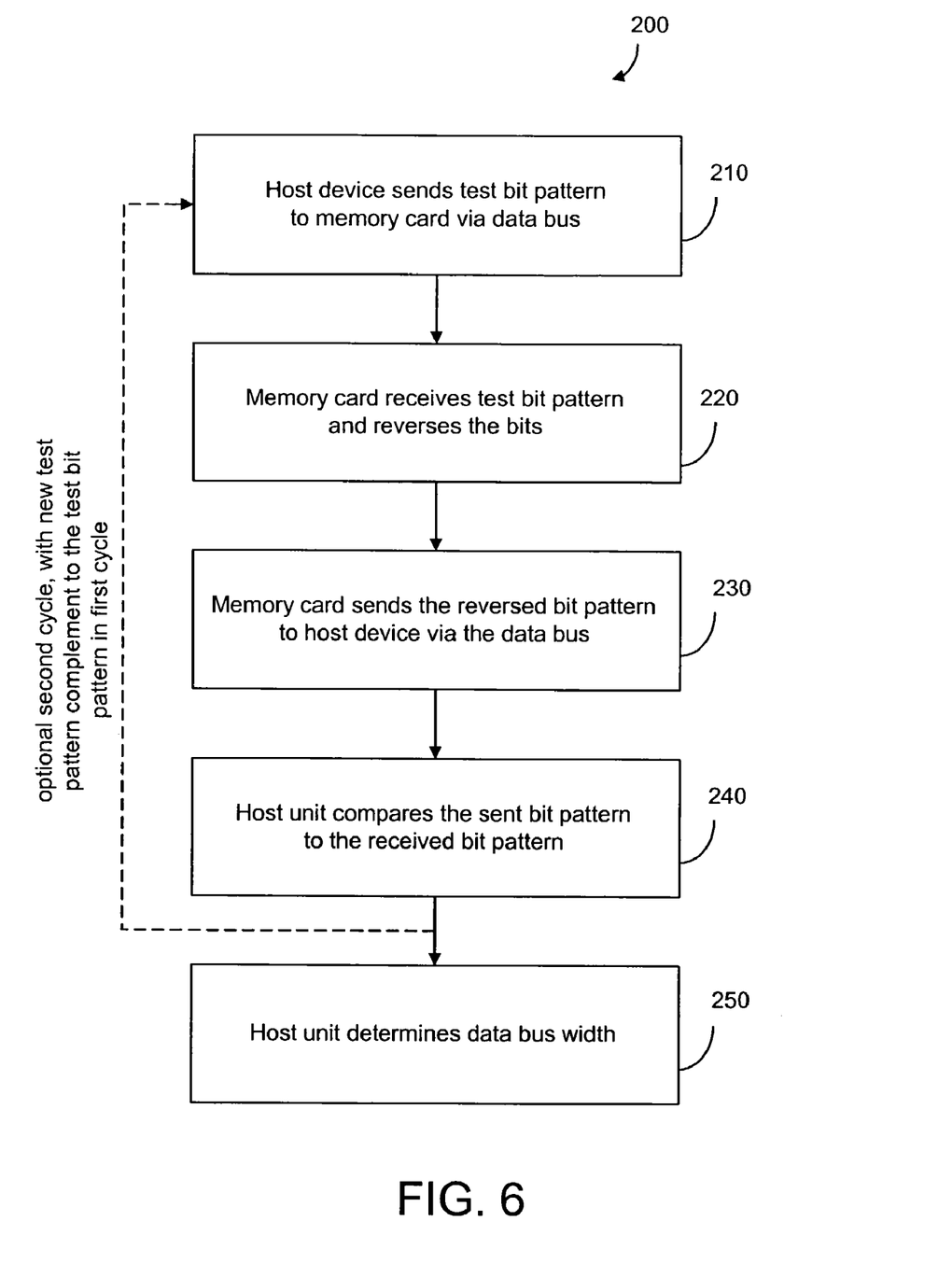
FIG. 6 is a flowchart showing the data bus width checking procedure, according to the present invention.

FIG. 6 is a flowchart illustrating the data bus width checking procedure, according to the present invention. As shown in the flowchart 200, the host device sends a test bit pattern, at step 210, to the memory card via the data bus. The memory card reverses the received test bit pattern at step 220, and sends the reversed bit pattern to the host device at step 230. By comparing the test bit pattern to the received bit pattern from the memory unit, at step 240, the host device determines the usable width of the data bus at step 250. If desirable, a second cycle can be carried out, similar to steps 220 to 240. Preferably, the test bit pattern in the second cycle is complementary to the test bit pattern in step 220. The second cycle can be used to ensure that no bit in the data bus is stuck to '0' or '1'.

Thus, although the invention has been described with respect to an embodiment thereof, it will be understood by those skilled in the art that the foregoing and various other changes, omissions and deviations in the form and detail thereof may be made without departing from the scope of this invention.

What is claimed is:

1. A method for checking a data bus between a first electronic module and a second electronic module operatively connected to the first electronic module, said method comprising:
    conveying from the first electronic module to the second electronic module a first bit pattern through the data bus;
    receiving in the first electronic module a second bit pattern from the second electronic module through the data bus; the second bit pattern contains at least a part of a complementary pattern of the first bit pattern;
    comparing the received second bit pattern to the first bit pattern for determining a usable bus width of the data bus based on a relationship between the first bit pattern and the complementary pattern of the first bit pattern.

2. The method of claim 1, wherein the first electronic module has a maximum bus width defined by a predetermined number of bits and the received second bit pattern has a section in which the pattern is complementary to the corresponding part of the first bit pattern, said section having a further number of bits smaller than the predetermined number of bits, and wherein said comparing step determines the usable width of the data bus based on the section in the received second bit pattern.

3. The method of claim 1, wherein the first bit pattern has an alternate pattern of '0' and '1'.

4. The method of claim 1, wherein each bit in the received first bit pattern and the second bit pattern has a value of either '0' or '1', and second bit pattern is complementary to the received first bit pattern such that a bit in the second bit pattern has a value different from the value of the corresponding bit in the received first bit pattern.

5. The method of claim 1, further comprising:
    conveying to the second electronic module a third bit pattern through the data bus, wherein the third bit pattern contains at least a part of a complementary pattern of the first bit pattern; and
    receiving from the second electronic module a fourth bit pattern through the data bus, the fourth bit pattern having the predetermined relationship to the third bit pattern as received in the second electronic module.

6. The method of claim 5, further comprising
    comparing the fourth bit pattern as received in the first electronic module to the third bit pattern for determining the usable bus width.

7. The method of claim 1, wherein the second electronic module comprises a memory card.

8. The method of claim 7, wherein the first electronic module has a maximum bus width and the memory card has a number of data pins, the number of data pins is equal to the number of bits conveyable on the maximum bus width.

9. The method of claim 7, wherein the first electronic module has a maximum bus width and the memory card has a number of data pins, the number of data pins is smaller than the number of bits conveyable on the maximum bus width.

10. The method of claim 7, wherein the first electronic module has a maximum bus width and the memory card has a number of data pins, the number of data pins is greater than the number of bits conveyable on the maximum bus width.

11. A software application product embedded in a computer readable medium for use in a first electronic module for checking a data bus between the first electronic module and a second electronic module, said computer readable medium having a plurality of executable codes comprising:
    a code for comparing
        a first bit pattern provided to the second electronic module through the data bus to
        a second bit pattern received through the data bus from the second electronic module, wherein the second bit pattern is provided in response to the first bit pattern as received in the second electronic module, the second bit pattern having at least a part of a complementary pattern of the received first bit; and
    a further code for determining a usable bus width of the data bus based on a relationship between the first bit pattern and the complementary pattern of the first bit pattern.

12. The software application product of claim 11, wherein the received first bit pattern has an alternate pattern of '0' and '1' and the second bit pattern is complementary to the received first bit pattern.

13. The software application product of claim 11, further comprising a third code for generating the first bit pattern.

14. The software application product of claim 11, wherein the first electronic module has a maximum bus width defined by a predetermined number of bits, and the received second bit pattern has a section in which the pattern is complementary to the corresponding part of the first bit pattern, said section having a further number of bits smaller than the predetermined number of bits, and wherein the further code determines the usable width of the data bus based on the section in the received second bit pattern.

15. The software application product of claim 11, wherein the code also compares
    a third bit pattern provided to the second electronic module through the data bus to
    a fourth bit pattern received through the data bus from the second electronic module, wherein the third bit pattern is complementary to the first bit pattern and the fourth bit pattern is provided in response to the third bit pattern as received in the second electronic module, and the fourth bit pattern having the predetermined relationship to the received third bit pattern, so as to allow the further code to determine the usable bus width of the data bus.

16. A memory unit for use in an electronic device, the electronic device having a host electronic module for processing data and a data bus for operatively connecting the host module to the memory unit, said memory unit comprising:

means for receiving a first bit pattern from the host module through the data bus; and means, responsive to the received first bit pattern, for providing a second bit pattern on the data bus, wherein the second bit pattern has at least a part of a complementary pattern of the received first bit pattern, wherein the host electronic module is adapted to compare the first bit pattern to the second bit pattern as received in the host module for determining a usable bus width of the data bus based on a predetermined relationship between the first bit pattern and the complementary pattern of the first bit pattern.

17. The memory unit of claim 16, wherein the received first bit pattern has an alternate pattern of '0' and '1' and the second bit pattern is complementary to the received first bit pattern.

18. The memory unit of claim 16, wherein the data bus has a maximum bus width and the memory unit has a number of data pins for operatively connecting to the data bus, and wherein the number of data pins is smaller than number of data bits conveyable in the maximum bus width.

19. The memory unit of claim 16, wherein the data bus has a maximum bus width and the memory unit has a number of data pins for operatively connecting to the data bus, and wherein the number of data pins is equal to number of data bits conveyable in the maximum bus width.

20. The memory unit of claim 16, wherein the data bus has a maximum bus width and the memory unit has a number of data pins for operatively connecting to the data bus, and wherein the number of data pins is greater than number of data bits conveyable in the maximum bus width.

21. An electronic device having means to receive a memory unit, comprising:

a data processing unit;

a data bus linking the data processing unit to the memory unit; and a program for checking electronic functionality of the data bus, the program comprising:

a code for providing a first bit pattern to the memory unit through the data bus, a code for requesting the memory unit to provide a second bit pattern, the second bit pattern containing at least a part of a complementary pattern of the first bit pattern, a code for comparing the first bit pattern with a second bit pattern as received through the data bus from the memory unit, and a code for determining a usable width of the data bus based on the received second bit pattern based on a complementary relationship between the first bit pattern and the complementary pattern.

22. The electronic device of claim 21, wherein the program further comprises a further code for providing a third bit pattern to the memory unit through the data bus, wherein the third bit pattern is complement to the first bit pattern, so as to allow the further code to compare the third bit pattern with a fourth bit pattern received through the data bus from the memory unit, the fourth bit pattern is provided in response to the third bit pattern as received in the memory unit and the fourth bit pattern has the predetermined relationship to the received third bit pattern, and wherein the third code determines the usable width of the data bus also based on the received fourth bit pattern.

23. The electronic device of claim 21, wherein said program for checking the electronic functionality of the data bus is carried out at a boot up procedure.

24. The electronic device of claim 21, comprising a mobile phone.

25. The electronic device of claim 21, wherein said memory unit is disposed in a further electronic device.

26. The electronic device of claim 21, wherein the memory unit comprises:

means for receiving the first bit pattern from the data process unit through the data bus; and means, responsive to the first bit pattern as received through the data bus, for providing the second bit pattern on the data bus.

27. The electronic device of claim 21, wherein the first bit pattern has an alternate pattern of '0' and '1'.

28. The electronic device of claim 21, wherein each bit of the received first bit pattern and the second bit patterns has a value of either '0' or '1', and the second bit pattern is complement to the received first bit pattern.

* * * * *

UNITED STATES PATENT AND TRADEMARK OFFICE
CERTIFICATE OF CORRECTION

PATENT NO. : 7,036,054 B2
APPLICATION NO. : 10/614341
DATED : April 25, 2006
INVENTOR(S) : Floman et al.

It is certified that error appears in the above-identified patent and that said Letters Patent is hereby corrected as shown below:

In column 8, line 29, which is claim 11, line 14 "bit" should be --bit pattern--.

Signed and Sealed this

Twelfth Day of September, 2006

JON W. DUDAS
*Director of the United States Patent and Trademark Office*